United States Patent
Vangool et al.

(10) Patent No.: US 9,989,576 B2
(45) Date of Patent: Jun. 5, 2018

(54) TWO-WIRE RESISTANCE TERMINATED GROUND CHECK

(71) Applicant: LITTELFUSE, INC., Chicago, IL (US)

(72) Inventors: Michael Vangool, Saskatoon (CA); Nehad El-Sherif El-Kharbawe, Saskatoon (CA); George J. Fenty, Saskatoon (CA)

(73) Assignee: Littelfuse, Inc., Chicago, IL (US)

( * ) Notice: Subject to any disclaimer, the term of this patent is extended or adjusted under 35 U.S.C. 154(b) by 274 days.

(21) Appl. No.: 15/047,875

(22) Filed: Feb. 19, 2016

(65) Prior Publication Data

US 2016/0245854 A1 Aug. 25, 2016

Related U.S. Application Data

(60) Provisional application No. 62/118,197, filed on Feb. 19, 2015.

(51) Int. Cl.
| | |
|---|---|
| *G01R 31/14* | (2006.01) |
| *H02H 9/08* | (2006.01) |
| *G01R 31/02* | (2006.01) |
| *G01R 27/18* | (2006.01) |
| *H02H 3/16* | (2006.01) |

(52) U.S. Cl.
CPC ........... *G01R 31/025* (2013.01); *G01R 27/18* (2013.01); *G01R 31/021* (2013.01); *H02H 3/165* (2013.01)

(58) Field of Classification Search
CPC .... G01R 31/025; G01R 31/021; G01R 27/18; H02H 3/165
USPC .................... 324/509, 510; 361/42
See application file for complete search history.

(56) References Cited

U.S. PATENT DOCUMENTS

| | | | | |
|---|---|---|---|---|
| 4,321,643 A | * | 3/1982 | Vernier | ............... G01R 31/024 |
| | | | | 324/509 |
| 6,304,089 B1 | | 10/2001 | Paulson et al. | |
| 2014/0177110 A1 | * | 6/2014 | Curtis | ..................... H02H 9/08 |
| | | | | 361/42 |

* cited by examiner

*Primary Examiner* — Amy He

(57) ABSTRACT

A ground check monitoring device coupled to a trailing cable includes a voltage source and a switch. The trailing cable includes a first conductor, a second conductor, and a ground conductor. A resistive termination device is coupled between the first conductor and the ground conductor. A controller of the ground check monitoring device can toggle the switch between a first node of the first conductor and a second node of the second conductor. By measuring voltages at the first and second nodes, the ground check monitoring device can determine if the resistive termination device is shorted. Further, the controller can calculate resistance values of the first and second conductors and calculate a resistance value of the ground conductor. The calculated resistance values can be compared to expected values and the controller can signal a ground fault condition as appropriate based on the comparisons.

24 Claims, 4 Drawing Sheets

TWO-WIRE RESISTANCE TERMINATED GROUND CHECK

CROSS-REFERENCE TO RELATED APPLICATION

This application claims priority to U.S. Provisional Patent Application No. 62/118,197, filed Feb. 19, 2015, entitled "Two-wire Resistance Terminated Ground Check," which is incorporated by reference herein in its entirety.

FIELD OF THE DISCLOSURE

This disclosure relates generally to the field of ground check monitors and more particularly to a two-wire resistance-based ground check.

BACKGROUND OF THE DISCLOSURE

Mining equipment often requires power from an external power source. The mining equipment may be tethered to the external power source by portable power cables, which may be referred to as trailing cables. The trailing cables are used to supply power to various types of mining equipment such as, for example, pumps, drills, shovels, and other mining machines.

Trailing cables and mining equipment attached thereto often pose elevated safety risks. Mine machine operators may be exposed to electrical hazards caused by trailing cable damage, a line-to-ground fault existing in the mining machine, or a broken or damaged ground conductor. To ensure proper grounding of the mining machine, a ground check monitor can be used with the trailing cables. In the event of trailing cable damage as detected by the ground check monitor, mining equipment can be de-energized to protect the mining machine operator.

Conventional ground check monitors suffer from one or more problems. For example, conventional ground check monitors often use a Zener diode terminated ground check circuit. Alternating current (AC) effects can be induced on a Zener diode terminated ground check circuit. The induced AC effects on the Zener diode can create a significant error on a measured ground resistance, thus making it virtually impossible to measure ground resistance to a required accuracy.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Accordingly, a need exists for an improved ground check monitor for trailing cables that provides immunity to induced AC effects without requiring advanced filtering techniques while also providing measurement of ground resistance to a required accuracy.

Various embodiments described herein provide a two-wire resistance-based ground check termination circuit and methods for using the same. According to various embodiments, a ground check monitoring device is coupled to a trailing cable. The ground check monitoring device can include a voltage source and a switch. The trailing cable can include a first conductor, a second conductor, and a ground conductor. A resistive termination device can be coupled between the first conductor and the ground conductor. A controller of the ground check monitoring device can toggle the connectivity of the switch between a first node of the first conductor and a second node of the second conductor. By measuring voltages at the first and second nodes, the ground check monitoring device can determine if the resistive termination device is shorted. Further, the controller can calculate resistance values of the first and second conductors and calculate a resistance value of the ground conductor. The calculated resistance values can be compared to expected values or predetermined thresholds and the controller can signal a ground fault condition as appropriate based on the comparisons.

BRIEF DESCRIPTION OF THE DRAWINGS

By way of example, specific embodiments will now be described, with reference to the accompanying drawings, in which.

DETAILED DESCRIPTION

Figure 1:
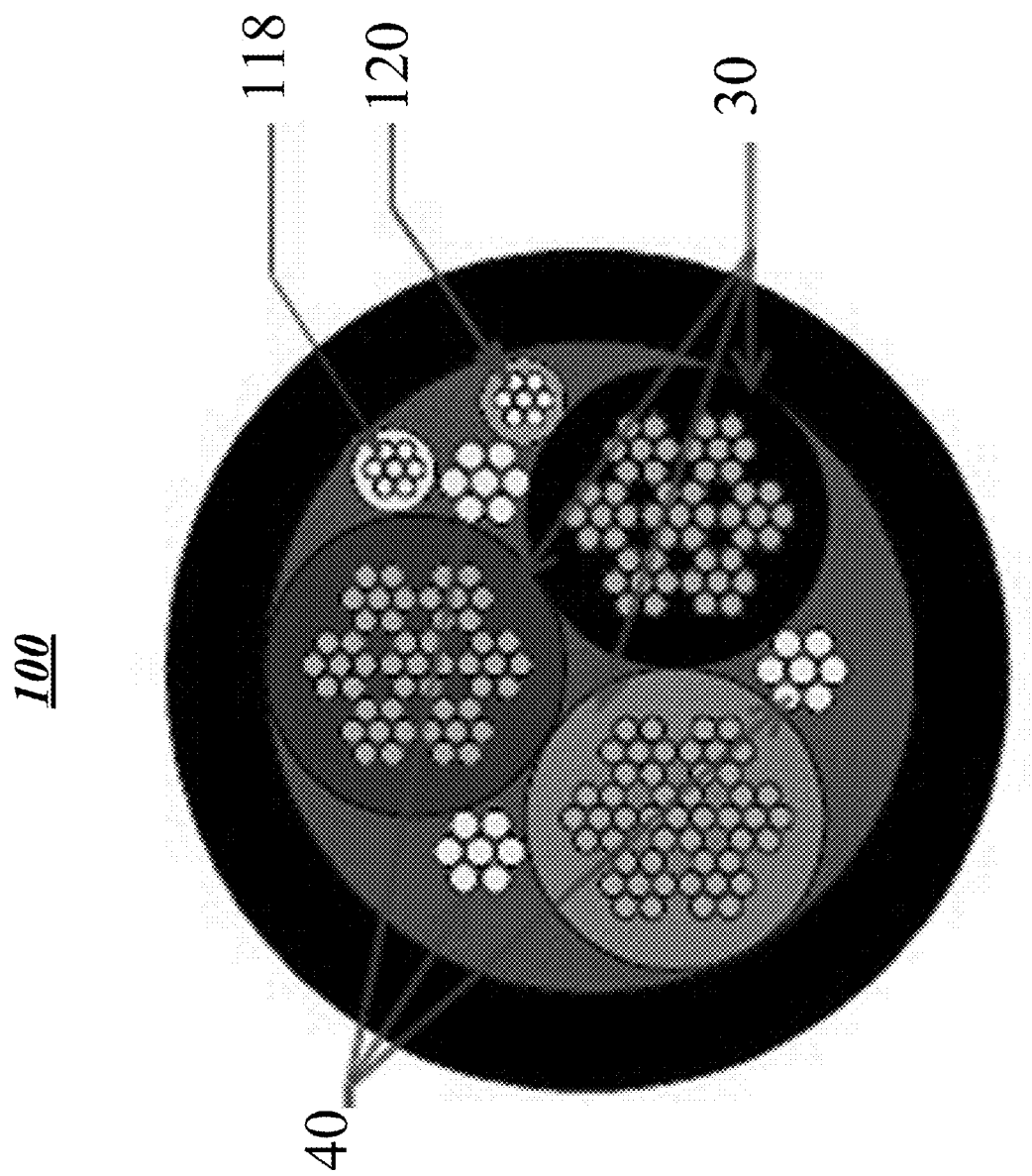
FIG. 1 illustrates a cross-sectional view of an exemplary trailing cable in accordance with the present disclosure.

The present disclosure will now be described more fully hereinafter with reference to the accompanying drawings, in which preferred embodiments are shown. This disclosure, however, may be embodied in many different forms and should not be construed as limited to the embodiments set forth herein. Rather, these embodiments are provided so that this disclosure will be thorough and complete, and will fully convey the scope of the disclosure to those skilled in the art. In the drawings, like numbers refer to like elements throughout.

FIG. 1 illustrates a cross-sectional view of an exemplary trailing cable 100. As shown in FIG. 1, the trailing cable 100 may include ground conductors (e.g., ground wires) 40 and three phase conductors 30. The trailing cable 100 may further include two insulated ground check wires (e.g., pilot wires), such as a first insulated ground check wire 118 and a second insulated ground check wire 120. The first insulated ground check wire 118 and the second insulated ground check wire 120 can be used to monitor continuity and/or integrity of the ground conductors 40. That is, the first insulated ground check wire 118 and the second insulated ground check wire 120 may be used to monitor continuity and/or the integrity of the ground conductors 40 to ensure that, upon occurrence of a ground fault, ground-fault protection is achieved.

Figure 4:
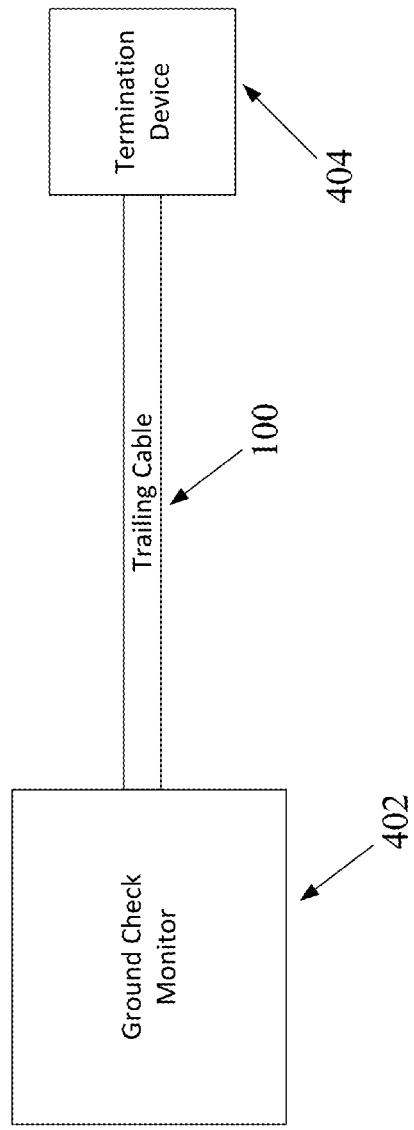
FIG. 4 illustrates a ground check monitoring system in accordance with the present disclosure.

FIG. 4 illustrates a ground check monitoring system 400 of the present invention. As shown in FIG. 4, the ground check monitoring system 400 can include a ground check monitor 402 (or ground check monitoring device 402), the trailing cable 100, and a termination device 404. The trailing cable 100 can be coupled to the ground check monitor 402 and can be coupled to the termination device 404. The termination device 404 can be a resistive termination device. As such, the termination device 404 can be a linear device.

The following provides further detail on the components of the ground check monitoring system 400 and its operation.

Figure 2:
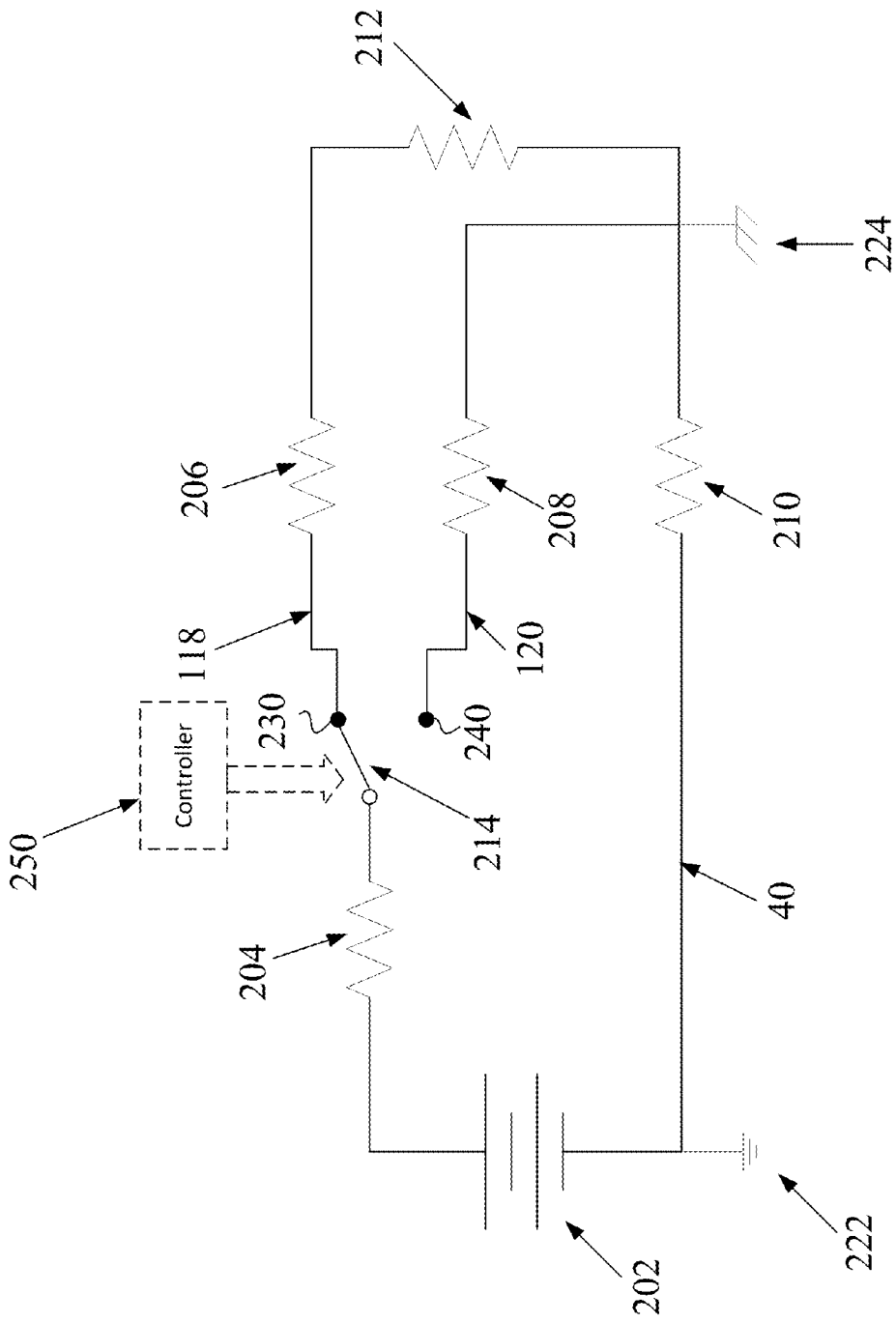
FIG. 2 illustrates a schematic of a two-wire resistance terminated ground check monitoring circuit in accordance with the present disclosure.

FIG. 2 illustrates a schematic of a ground check termination circuit 200. The ground check termination circuit 200 includes a power source 202 (e.gf., a voltage source 202), a switch 214, the first insulated ground check wire 118, the second insulated ground check wire 120, resistor 204, resistor 206, resistor 208, resistor 210, resistor 212, earth ground 222, chassis ground 224, ground conductor 40, and nodes 230 and 240. The ground check termination circuit 200 can further include a controller 250 (shown in phantom). The controller 250 can control operation of the switch 214. Further operative features of the controller 250 are described herein.

The ground check termination circuit 200 can represent the ground check monitoring system 400 depicted in FIG. 4. For example, the voltage source 202, the resistor 204, the switch 214, and the controller 250 can represent a portion of the ground check monitor 402. The first insulated ground check wire 118, the resistor 206, the second insulated ground check wire 120, the resistor 208, the ground conductor 40, and the resistor 210 can represent a portion of the trailing cable 100 (e.g., as depicted in FIG. 4). The resistor 212 can represent the termination device 404 depicted in FIG. 4.

The voltage source 202 can represent an internal circuit voltage generated by a ground check monitoring device (e.g., the ground check monitor 402). The voltage source 202 can provide, as an example, approximately 24 volts-direct current (Vdc). The resistor 204 can represent an internal sense resistance (or internal resistance) in the ground check monitoring device. The resistor 204 may have a resistance value of, e.g., approximately 132 ohms. The switch 214 can also be internal to the ground check monitoring device. The switch 214 can be coupled in series with the voltage source 202. The switch 214 can also be coupled to the first ground check line 118 and the second ground check line 120. As such, the switch 214 may toggle and select between the two insulated ground check wires 118, 120 in the trailing cable 100. Accordingly, by use of the switch 214, a voltage provided by the voltage source 202 may be applied to the first ground check line 118 or the second ground check line 120 to provide an excitation of these pilot wires. The switch 214 can be controlled by the controller 250 to measure and store voltages measured at the nodes 230, 240. The measurement of voltages at or of the nodes 203, 240 can be made relative to a ground (e.g., an earth ground). The wires 118 and 120 can be considered to be first and second conductors 118, 120, respectively.

The resistor 206 can represent the resistance of the first ground check line or pilot wire 118 in the trailing cable 100. The resistor 208 can represent the resistance of the second ground check line or pilot wire 120 in the trailing cable 100. The resistor 210 may represent the resistance of the grounding conductor 40 in the trailing cable 100. The resistor 210 may have a value of, e.g., less than 4 ohms.

The resistor 212 can represent the resistance of a termination device attached between the pilot wire 118 and the chassis ground 224/ground conductor 40. The resistor 212 can have a value of, e.g., approximately 6 ohms. By using the resistor 212 in the termination device associated with the monitoring equipment (as opposed to using a Zener diode), the monitoring equipment described herein has increased immunity to induced alternating current (AC) effects, thereby enabling the detection of a 4 ohm or less ground resistance which is more accurate than conventional monitoring systems.

The resistor 212 of the termination device may be located at a junction box of the equipment receiving the trailing cable 100. At the other end of the trailing cable 100 (i.e., at the location of a voltage source 202), the first insulated ground check wire 118 and the second insulated ground check wire 120 and the ground conductors 40 can be connected to terminals of a ground check monitor, which measures and monitors the electrical characteristics between terminals of the ground check monitor. As shown in FIG. 2, the resistor 212 can be coupled to the first conductor 118 and to the chassis ground 224. The ground conductor 40 can be represented as coupling the earth ground 222 to the chassis ground 224. As further shown in FIG. 2, a negative terminal of the voltage source 202 can be coupled to the ground conductor 40 such that the resistor 212 (or termination device) can be considered to be coupled between the first conductor 118 and the ground conductor 40.

In operation, the ground check monitor detects a fault condition using the ground check termination circuit 200. Upon detecting the fault condition, the trailing cable 100 may be de-energized. Alternatively, if no fault condition exists, the ground check monitor permits the trailing cable 100 to be energized (or remain energized). The ground check termination circuit 200 allows for the voltages of nodes 230, 240 to be monitored and measured and for the resistance values of the resistors 206, 208 and 210 to be calculated as part of the ground check operation or monitoring.

Operation of the ground check termination circuit 200 to determine and/or detect a ground fault can proceed as follows. The switch 214 may be connected to the first insulated ground check wire 118 and an excitation may be applied to the first insulated ground check wire 118. The voltage at node 230 of the first insulated ground check wire 118 can be measured. The voltage of node 240 of the second insulated ground check wire 120 can also be measured. Next, the switch 214 is toggled to the second insulated ground check wire 120. The voltage of the node 230 of the first insulated ground check wire 118 can again be measured. The voltage of the node 240 of the second insulated ground check wire 120 can also again be measured. The measured voltages for nodes 230 and node 240 are stored and used as standardized operational parameters. The measured voltages for nodes 230 and 240 can also be used to verify that the termination resistor 212 is not shorted (or alternatively, determine that the termination resistor 212 is in a short condition).

After verifying that the termination resistor 212 is not shorted, the switch 214 can be reconnected to the first insulated ground check wire 118. The voltage at nodes 230 and 240 can again be measured. The re-measured voltages of nodes 230 and 240 can be compared to the standardized operational parameters and can also be used to calculate the resistance of the ground conductor 40 (i.e., the value of resistor 210) and/or the resistance of the pilot wires 118 and/or 120. If the re-measured voltages and/or if the calculated resistances deviate significantly from expected values, then a ground check failure condition can be determined and a ground check failure signal or other alarm can be issued, as described below.

When the power source 202 provides an excitation to the pilot wire 118 (when the switch 214 is coupled to the pilot wire 118), no current flows through the second pilot wire 120. The voltages at nodes 230, 240 can then be described by the following respective equations:

$$V_{230} = \frac{(R_{206} + R_{212} + R_{210})}{R_{206} + R_{212} + R_{210} + R_{204}} * V_{202}, \quad (1)$$

$$V_{240} = \frac{(R_{210})}{R_{206} + R_{212} + R_{210} + R_{204}} * V_{202}, \quad (2)$$

where $V_{202}$ represents the voltage provided by the voltage source 202, $V_{230}$ is the voltage at node 230, $V_{240}$ is the voltage at node 240, $R_{204}$ is the resistance of resistor 204, $R_{206}$ is the resistance of resistor 206, $R_{210}$ is the resistance of resistor 210, and $R_{212}$ is resistance of resistor 212.

In contrast, when the switch 214 is connected to the second insulated ground check wire 120 at node 240, the voltages $V_{230}$ and $V_{240}$ are given by:

$$V_{230} = \frac{(R_{210})}{R_{210} + R_{208} + R_{204}} * V_{202}, \quad (3)$$

$$V_{240} = \frac{(R_{210} + R_{208})}{R_{210} + R_{208} + R_{204}} * V_{202}, \quad (4)$$

where $R_{208}$ is the resistance of resistor 208.

For the same trailing cable 100, the resistance of the pilot wire 118 can be considered to be substantially equal to the resistance of the pilot wire 120 (e.g., $R_{206} = R_{208} = R_{GC}$), such that equations (1)-(4) may be reduced to:

$$V_{230} = \frac{(R_{GC} + R_{212} + R_{210})}{R_{GC} + R_{212} + R_{210} + R_{204}} * V_{202}, \quad (5)$$

$$V_{240} = \frac{(R_{210})}{R_{GC} + R_{212} + R_{210} + R_{204}} * V_{202}, \quad (6)$$

$$V_{230} = \frac{(R_{210})}{R_{210} + R_{GC} + R_{204}} * V_{202}, \quad (7)$$

$$V_{240} = \frac{(R_{210} + R_{GC})}{R_{210} + R_{GC} + R_{204}} * V_{202}. \quad (8)$$

By measuring $V_{230}$ and $V_{240}$, the only unknown values in the circuit are $R_{GC}$ and $R_{210}$. It should be noted that all voltages can be measured relative to earth ground 222. Given there are four (4) equations (equations 5-8) and two (2) unknown values (e.g., $R_{GC}$ and $R_{210}$), this can be considered to be an over-determined system of linear equations. In other words, at normal/standard operation only two (2) sets of equations are needed and the other two equations are unnecessary to determine $R_{GC}$ and $R_{210}$. Accordingly, during normal operation, there is no switching needed between the first insulated ground check wire 118 and the second insulated ground check wire 120. That is, switch 214 can remain connected to node 230 of the first insulated ground check wire 118. Switching between the two ground conductor terminals (e.g., switching between the first insulated ground check wire 118 and the second insulated ground check wire 120) can be performed during a start-up operation, as mentioned above, to ensure that the termination resistor (e.g., $R_{212}$) is not shorted.

To determine if resistor 212 is shorted or not, resistor 212 (which can be represented as the terminal resistance $R_{212}$) is disconnected from the voltage source 202 by connecting switch 214 to the second insulated ground check wire 120 (e.g., the second terminal "terminal GC2") and measuring voltages $V_{230}$ at node 230 and voltage $V_{240}$ at node 240. Next, resistor 212 (e.g., $R_{212}$) is connected to the ground check termination circuit 200 (when switch 214 is connected to the first insulated ground check wire 118 (e.g., "terminal GC1") by connecting switch 214 to the first insulated ground check wire 118 and measuring again voltages $V_{230}$ at node 230 and voltage $V_{240}$ at node 240.

By comparing voltages $V_{230}$ at node 230 and voltage $V_{240}$ at node 240 taken at each state of the switch 214, it can be determined if resistor 212 is shorted or not. Specifically, if voltage $V_{230}$ at node 230 (when switch 214 is connected to the first insulated ground check wire 118) and voltage $V_{240}$ at node 240 (when switch 214 is connected to the second insulated ground check wire 120) are approximately equal, the termination resistor (e.g., $R_{212}$) is shorted. Similarly, if voltage $V_{230}$ at node 230 (when switch 214 is connected to the second insulated ground check wire 120) and voltage $V_{240}$ at node 240 (when switch 214 is connected to the first insulated ground check wire 118) are approximately equal, the termination resistor (e.g., $R_{212}$) is shorted.

This is validated by comparing equation 5 to equation 8 or by comparing equation 6 to equation 7 when $R_{212}$ is equal to zero (0) to represent a short. If $R_{212}$ is equal to zero (0), equations 5 and 8 reduce to the same equation and equations 6 and 7 reduce to the same equation.

After startup, and after it is confirmed that the termination resistor 212 is not shorted, the switch 214 can be toggled back to the pilot wire 118. Values for resistor 206 and the resistor 210 can then be calculated based on measurement of the voltages at nodes 230, 240. In other words, values for $R_{GC}$ and $R_G$ can be calculated and compared to expected values once the switch 214 is connected to node 230 by measuring voltage $V_{230}$ at node 230 and voltage $V_{240}$ at node 240 and then solving for $R_{GC}$ and $R_G$ using 2 of the above equations (two of the above equations (5)-(8)). If there is a deviation from expected values, a fault condition can be flagged.

To illustrate and validate this approach, assume that the termination resistance $R_{212}$ is 6 ohms, the internal sense resistor $R_{204}$ is equal to 132 ohms, and the internal circuit voltage $V_{202}$ is 24 Volts (V). These values are assumed and used below for illustration purposes and by way of example only. During post-startup monitoring, these values, when plugged into equation (5), provide the following:

$$V_{230} = \frac{(R_{GC} + 6 + R_{210})}{R_{GC} + R_{210} + 138} * 24. \quad (5')$$

Rearranging equation (5') with the inserted values, equation (9) can be derived as follows:

$$R_{210} + R_{GC} = \frac{(144 - 138 * V_{230})}{V_{230} - 24}. \quad (9)$$

Plugging in the exemplary values into equation (6) provides the following:

$$V_{240} = \frac{(R_{210})}{R_{GC} + R_{210} + 138} * 24, \quad (6')$$

which can be arranged to provide equation (10) as follows:

$$(24 - V_{240})R_{210} - V_{240} * R_{GC} = 138 * V_{240} \quad (10).$$

From equations (9) and (10), it can be seen that $R_{GC}$ and $R_{210}$ can be calculated based on measured values for $V_{230}$ and $V_{240}$. Deviations from expected values for the resistance of resistor 206 ($R_{GC}$) or the resistance of the resistor 210 ($R_{210}$) can cause a fault to be flagged. For example, a flag or alarm can be signaled or the ground check termination circuit 200 can be tripped if $R_{GC}+R_{210}$ is greater than a predetermined threshold such as, for example, 30 ohms.

If the termination resistor (e.g., $R_{212}$) is shorted ($R_{212}=0$), then equation (5) and equation (8), using the exemplary circuit values, can now become equation (11) and equation (12) respectively:

$$V_{230} = \frac{(R_{GC} + R_{210})}{R_{GC} + R_{210} + 132} * 24, \quad (11)$$

$$V_{240} = \frac{(R_{GC} + R_{210})}{R_{GC} + R_{210} + 132} * 24, \quad (12)$$

with equations (11) and (12) becoming the same equation. Further, equation (6) and equation (7), using the exemplary circuit values, can now become equation (13) and equation (14), respectively:

$$V_{240} = \frac{(R_{210})}{R_{GC} + R_{210} + 132} * 24, \quad (13)$$

$$V_{230} = \frac{(R_{210})}{R_{GC} + R_{210} + 132} * 24, \quad (14)$$

with equations (13) and (14) becoming the same equation. It should be noted that in equations (11) and (14), the state of switch 214 is connected to node 230. In equations (12) and (13), the state of switch 214 is connected to node 240. In equations (11)-(14), $R_{210}$ is expected to be equal to or less than 4 ohms.

Alternatively, the resistance of resistor 206 (e.g., $R_{GC}$) or the resistance of the resistor 210 (e.g., $R_{210}$ or $R_G$) can separately be compared to expected values or predetermined thresholds. For example, if the value of the resistor 206 (RGc) exceeds a certain predetermined threshold, a ground check failure can be signaled or flagged. Further, in response thereto, the controller 250 can de-energize the trailing cable 100. Similarly, if the value of the resistor 210 ($R_{210}$ or $R_G$) exceeds a certain predetermined threshold, a ground check failure can also be signaled or flagged and, in response thereto, the controller 250 can also de-energize the trailing cable 100. The controller 250 can provide the functionality for making such comparisons and signaling any determined ground check failure. The same comparisons can be made in a similar manner for the resistance of resistor 208.

In general, the controller 250 can operate to control the toggling and state of the switch 214. Further, the controller 250 can provide the functionality described herein for taking, for example, voltage measurements and calculating, for example, resistance values. When the switch 214 is coupled to the node 230, the switch 214 can be considered to be in a first state. When the switch 214 is coupled to the node 240, the switch can be considered to be in a second state. The controller 250 can measure the voltages of the nodes 230, 240 when the switch 214 is in the first state or the second state. The controller 250 can further include a memory or other storage device for storing any measured value (e.g., voltages of the nodes 230, 240 when the switch 214 is in the first state or the second state) or any calculated value (e.g., the resistances of the conductors 118, 120 or ground conductor 40). The controller 250 can also store one or more predetermined values or thresholds that can be used for comparison to one or more measured or calculated values. For example, the controller 250 can store any number of predetermined values related to expected voltages of the nodes 230, 240 or expected resistances of the conductors 118, 120 and ground conductor 40. The controller 250 can be programmed to adjust the stored threshold values and can be programmed to respond as desired to a detected ground check failure (e.g., by signaling an alarm and/or de-energizing one or more conductors within the trialing cable 100). Further, any measurement and any comparison made by the controller 250 can be based on approximate measurement values and comparison of any measured or calculated values can be made on an approximate value basis.

Further, as described herein, the voltage source 202 can provide a known voltage value, the resistor 204 can provide a known internal sense resistance value, and the resistor 212 can provide a known termination resistance value. Further, calculated values of the resistance of resistor 206 and the resistance of resistor 208 can be determined in various embodiments based on assuming the values are approximately equal, such that determination of one of the values provides the other value.

As described herein, a ground check monitor of the present disclosure can first determine if a termination resistance of a termination device is shorted or not (i.e., if a termination device is in a short condition). In doing so, the ground check monitor can determine the electrical connectivity condition of the termination device (e.g., determine if it is shorted or not). Also during this initial phase of operation, nominal or expected values of a ground resistance and a pilot cable resistance can be determined. Subsequent to the startup phase of operation, the ground check monitor of the present disclosure can periodically monitor voltages on the pilot wires and can determine if the expected voltages and/or the expected ground and cable resistances deviate from expectation, thereby resulting in a ground check fault condition. In response to a determined ground check fault condition an alarm or signal can be provided and/or a cable likely to include the ground fault condition (e.g., the trailing cable 100) can be de-energized.

Figure 3:
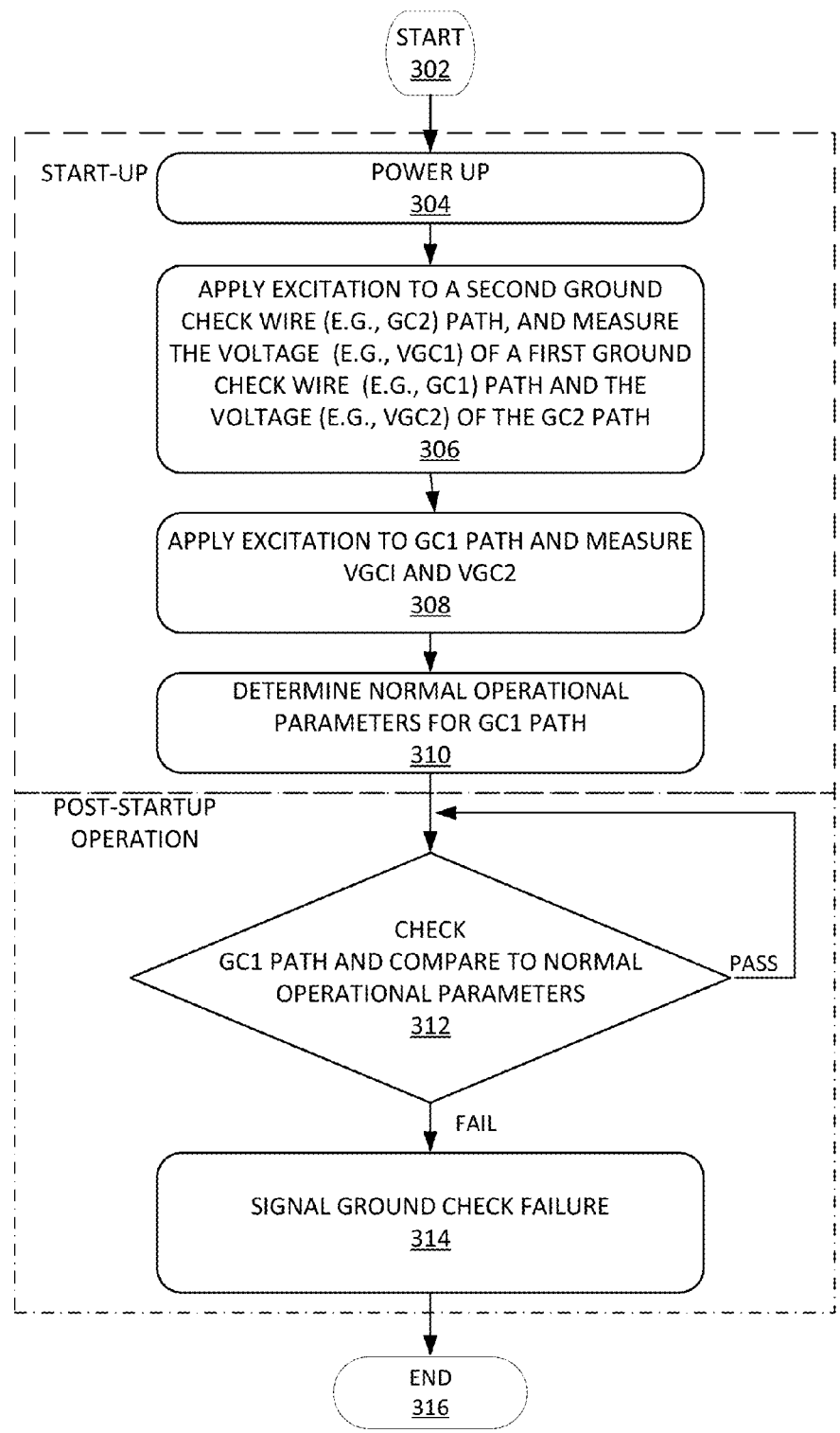
FIG. 3 is a flow chart illustrating a method of operating the two-wire resistance terminated ground check monitoring circuit of FIG. 2.

FIG. 3 is a flow chart 300 that illustrates a method for ground fault monitoring. The method can be used with ground check termination circuit 200 of FIG. 2. In various embodiments, equations (1) through (14) as describe above may be used in the method of operation 300. The method of operation 300 begins at block 302. The method of operation 300 moves to block 304. The method of operation 300 powers up a ground check monitoring device coupled to the trailing cable at block 304. The ground check monitoring device applies an excitation to an insulated ground check wire, such as insulated ground check wire 120, and measures the voltage at each node, such as voltage $V_{230}$ at node 230 of the first insulated ground check wire 118 and the voltage $V_{240}$ at node 240 of the second insulated ground check wire 120 at block 306. The excitation can be an application of a known voltage to the wire 118 by way of a switch controlled by a controller.

The ground check monitoring device applies an excitation to another insulated ground check wire, such as the first insulated ground check wire 118 and measures the voltages $V_{230}$ at node 230 of the first insulated ground check wire 118 and the voltage $V_{240}$ at node 240 of the second insulated ground check wire 120 at block 308. The excitation can be an application of the same known voltage to the wire 120 by way of toggling the state of the same switch as managed by the controller. Using the measured values (e.g., $V_{230}$ or $V_{240}$), the ground check monitoring device determines normal/standard operations parameters for the first insulated ground check wire 118 (e.g., GC1 path) at block 310. The determination of normal/standard operations parameters can include determining nominal values for the voltages at nodes 230, 240 and/or determining an expected resistance of the pilot wire 118 and resistance of a grounding conductor 40.

Steps 304 to 310 may be considered a startup phase. The startup phase can end once normal operation parameters are determined and if it is further determined that a termination resistance of the monitoring system is not shorted.

The method of operation 300 moves to block 312. The method of operation 300 determines/checks the first insulated ground check wire 118 (e.g., GC1 path as depicted in FIG. 1) and compares to the normal operational parameters at block 312. Voltages at nodes 230 and 240 can be re-measured and can be used to calculate resistance values for the pilot wire and the ground conductor. If the measured or calculated values deviated from expected values, a fault condition can be signaled at block 314.

If the currently measured operational parameters at block 312 compare well to the normal/standard operational parameters determined at block 310, then the method of operation 300 continues to monitor, check, and compare the currently monitored operational parameters to the operational parameters taken at start up (shown by the return path to block 312 from block 312 in FIG. 3). If the currently measured operational parameters do not compare well to the normal/standard operational parameters, then the method of operation 300 signals a ground check failure at block 314. The method of operation 300 may end at 316. It should be noted that block 312 and 314 may be defined as operations being conducted during normal/standard operations following a startup operation of the ground check monitoring apparatus.

As described herein, the present disclosure provides improved ground check monitoring using a two-wire resistance-based, ground check termination circuit. The circuit provides improved immunity to induced AC effects by eliminating use of a Zener diode which can create a significant error on a measured ground resistance, thus making it difficult to measure to a required or desired accuracy.

The present disclosure provides significant improvement and benefit by also providing the capability for a ground conductor-monitoring device to accurately and precisely measure ground, ground check wires, and a termination device resistance to a less than 1 ohm resolution. By use of a resistive termination, as compared to using a Zener diode termination, the resistive termination provides immunity to the induced AC without the use of advanced filtering techniques. Moreover, using two insulated ground check wires provides the ability to monitor for open and short circuit conditions of a termination device. Using the two insulated ground check wires eliminates any error induced by the ground check cable resistance thus allowing for accurate measurement of the ground resistance and the resistive termination device.

While the present disclosures references certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. An apparatus, comprising:
   a ground check monitoring device including a voltage source, a switch, and a controller for operating the switch, the ground check monitoring device having an internal sense resistance;
   a trailing cable including a first conductor, a second conductor, and a ground conductor, the first conductor having a first resistance, the second conductor having a second resistance, and the ground conductor having a third resistance, the trailing cable coupled to the ground check monitoring device; and
   a resistive termination device coupled between the first conductor and the ground conductor,
   wherein the controller couples the switch to the first conductor at a first node in a first state and couples the switch to the second conductor at a second node in a second state,
   wherein the controller measures voltages of the first and second nodes in the first and second states to determine when the resistive termination device is shorted.

2. The apparatus of claim 1, wherein the internal sense resistance represents an internal resistance of the ground check monitoring device.

3. The apparatus of claim 1, wherein the switch is coupled in series with the voltage source.

4. The apparatus of claim 1, wherein the ground conductor is coupled to the voltage source.

5. The apparatus of claim 1, wherein the first and second conductors are pilot wires.

6. The apparatus of claim 1, wherein a value of the first resistance is approximately equal to a value of the second resistance.

7. The apparatus of claim 1, wherein the controller determines the resistive termination device is shorted when the measured voltage of the second node when the switch is in the first state is approximately equal to the measured voltage of the first node when the switch is in the second state.

8. The apparatus of claim 1, wherein the controller determines the resistive termination device is shorted when the measured voltage of the second node when the switch is in the second state is approximately equal to the measured voltage of the first node when the switch is in the first state.

9. The apparatus of claim 1, wherein a value of the first resistance is approximately equal to a value of the second resistance and the controller calculates values of the first and second resistances and the third resistance based on the measured voltages of the first and second nodes, a known voltage value provided by the voltage source, a known value of the internal sense resistance, and a known resistance value of the resistive termination device.

10. The apparatus of claim 9, wherein the controller calculates values of the first and second resistances and the third resistance according to:

$$V_{first\ node} = \frac{(R_{first/second} + R_{termination} + R_{third})}{R_{first/second} + R_{termination} + R_{third} + R_{internal}} * V_{source}$$

$$V_{second\ node} = \frac{(R_{third})}{R_{first/second} + R_{termination} + R_{third} + R_{internal}} * V_{source}$$

where $V_{first\ node}$ is equal to the measured voltage of the first node when the switch is in the first state, $V_{second\ node}$ is the equal to the measured voltage of the second node when the switch is in the first state, $V_{source}$ is equal to the known voltage value provided by the voltage source, $R_{first/second}$ is equal to the value of one of the first or second resistances, $R_{termination}$ is equal to the known resistance value of the resistive termination device, $R_{third}$ is equal to the value of the third resistance, and $R_{internal}$ is equal to the known value of the internal sense resistance.

11. The apparatus of claim 9, wherein the controller calculates values of the first and second resistances and the third resistance according to:

$$V_{first\ node} = \frac{(R_{third})}{R_{third} + R_{first/second} + R_{internal}} * V_{source}$$

$$V_{second\ node} = \frac{(R_{third} + R_{first/second})}{R_{third} + R_{first/second} + R_{internal}} * V_{source}$$

where $V_{first\ node}$ is equal to the measured voltage of the first node when the switch is in the second state, $V_{second\ node}$ is the equal to the measured voltage of the second node when the switch is in the second state, $V_{source}$ is equal to the known voltage value provided by the voltage source, $R_{first/second}$ is equal to the value of one of the first or second resistances, $R_{termination}$ is equal to the known resistance value of the resistive termination device, $R_{third}$ is equal to the value of the third resistance, and $R_{internal}$ is equal to the known value of the internal sense resistance.

12. The apparatus of claim 9, wherein the controller compares the calculated value of one of the first and second resistances to a predetermined threshold.

13. The apparatus of claim 12, wherein the controller signals a ground check failure if the calculated value of one of the first and second resistances exceeds the predetermined threshold.

14. The apparatus of claim 12, wherein the controller de-energizes the trailing cable if the calculated value of one of the first and second resistances exceeds the predetermined threshold.

15. The apparatus of claim 9, wherein the controller compares the calculated value of the third resistance to a predetermined threshold.

16. The apparatus of claim 15, wherein the controller signals a ground check failure if the calculated value of the third resistance exceeds the predetermined threshold.

17. The apparatus of claim 15, wherein the controller de-energizes the trailing cable if the calculated value of the third resistance exceeds the predetermined threshold.

18. A method, comprising:
applying a known voltage from a ground check monitoring device to a first conductor of a trailing cable and measuring a first voltage of a first node of the first conductor and measuring a first voltage of a second node of a second conductor of the trailing cable, wherein a resistive termination device is coupled between the second conductor and a ground conductor of the trailing cable;
applying the known voltage from the ground check monitoring device to the second conductor and measuring a second voltage of the first node and a second voltage of the second node;
comparing the first measured voltage of the first node to the second measured voltage of the second node and comparing the second measured voltage of the first node to the first measured voltage of the second node; and
signaling a short condition when the first measured voltage of the first node is approximately equal to the second measured voltage of the second node or when the second measured voltage of the first node is approximately equal to the first measured voltage of the second node.

19. The method of claim 18, wherein a voltage source of the ground check monitoring device is coupled to the first conductor and the second conductor by a switch.

20. The method of claim 18, further comprising calculating a first resistance value of each of the first and second conductors and calculating a second resistance value of the ground conductor based on the known voltage from the ground check monitoring device, a known value of an internal sense resistance of the ground check monitoring device, a known resistance value of the resistive termination device, and the measured first and second voltages of each of the first and second nodes.

21. The method of claim 20, further comprising comparing the calculated first resistance value to a predetermined threshold.

22. The method of claim 21, further comprising signaling a ground check failure if the calculated first resistance value exceeds the predetermined threshold.

23. The method of claim 20, further comprising comparing the calculated second resistance value to a predetermined threshold.

24. The method of claim 23, further comprising signaling a ground check failure if the calculated second resistance value exceeds the predetermined threshold.

\* \* \* \* \*